(12) United States Patent
Hiltunen et al.

(10) Patent No.: US 11,906,606 B2
(45) Date of Patent: Feb. 20, 2024

(54) NMR MEASUREMENT UNIT FIXABLE WITHIN A PROCESS CHANNEL

(71) Applicant: Kaakkois-Suomen Ammattikorkeakoulu Oy, Mikkeli (FI)

(72) Inventors: Yrjö Hiltunen, Savonlinna (FI); Ekaterina Nikolskaya, Savonlinna (FI)

(73) Assignee: KAAKKOIS-SUOMEN AMMATTIKORKEAKOULU OY, Mikkeli (FI)

( * ) Notice: Subject to any disclaimer, the term of this patent is extended or adjusted under 35 U.S.C. 154(b) by 114 days.

(21) Appl. No.: 17/770,358

(22) PCT Filed: Oct. 21, 2020

(86) PCT No.: PCT/FI2020/050691
§ 371 (c)(1),
(2) Date: Apr. 20, 2022

(87) PCT Pub. No.: WO2021/079027
PCT Pub. Date: Apr. 29, 2021

(65) Prior Publication Data
US 2022/0397619 A1 Dec. 15, 2022

(30) Foreign Application Priority Data
Oct. 24, 2019 (FI) .................................... 20195912

(51) Int. Cl.
*G01R 33/30* (2006.01)
*G01N 24/08* (2006.01)
*G01R 33/44* (2006.01)

(52) U.S. Cl.
CPC ......... *G01R 33/307* (2013.01); *G01N 24/082* (2013.01); *G01R 33/448* (2013.01)

(58) Field of Classification Search
CPC ... G01R 33/307; G01R 33/448; G01N 24/082
See application file for complete search history.

(56) References Cited

U.S. PATENT DOCUMENTS 3,528,000 A 9/1970 Schwede
3,564,400 A 2/1971 Pike et al.
(Continued)

OTHER PUBLICATIONS

Finnish Search Report and Office Action related to priority Finnish application FI 20195912, dated May 5, 2020. (6 pages).
(Continued)

*Primary Examiner* — Gregory H Curran
(74) *Attorney, Agent, or Firm* — Lathrop GPM LLP; Richard Beem; Alex Shtraym

(57) ABSTRACT

The invention relates to an NMR system, and more particularly to an NMR measurement unit including a flow channel for separating a sample from a fluid stream in a process channel, a magnet arranged relative to flow channel for creating a magnetic field in part of flow channel, a coil arranged relative to flow channel for exciting NMR active nuclei of the sample in flow channel and for receiving the frequency pulse that returns to coil from NMR active nuclei, a frame comprising a fastening flange for sealing NMR measurement unit to process channel and a chamber that is closed relative to fluid stream and connected to fastening flange, arranged to be installed mainly inside process channel, within which chamber magnet and coil are arranged and through which chamber the flow channel passes, the frame installable such that flow channel is positioned inside process channel.

20 Claims, 9 Drawing Sheets

(56) References Cited

U.S. PATENT DOCUMENTS

| | | | |
|---|---|---|---|
| 4,820,982 A | | 4/1989 | Aubert |
| 5,371,464 A | | 12/1994 | Rapoport |
| 5,629,471 A | | 5/1997 | King |
| 8,860,412 B2 | | 10/2014 | Leveridge et al. |
| 9,335,195 B2 * | | 5/2016 | Ong .................... G01N 24/082 |
| 9,720,128 B2 | | 7/2017 | Kadayam Viswanathan et al. |
| 10,234,314 B2 * | | 3/2019 | Hogendoorn ........ G01N 24/082 |
| 11,674,835 B2 * | | 6/2023 | Bayer .................. G01R 33/307 |
| | | | 324/306 |
| 2004/0015332 A1 | | 1/2004 | Martin et al. |
| 2008/0150524 A1 | | 6/2008 | Song et al. |
| 2012/0001636 A1 | | 1/2012 | Price et al. |
| 2016/0305239 A1 | | 10/2016 | Hopper et al. |
| 2017/0074952 A1 | | 3/2017 | Kantzas et al. |
| 2018/0038924 A1 * | | 2/2018 | Rapoport ......... G01R 33/34015 |

OTHER PUBLICATIONS

International Search Report from PCT/FI2020/050691, dated Oct. 21, 2020. (41 pages).

\* cited by examiner

NMR MEASUREMENT UNIT FIXABLE WITHIN A PROCESS CHANNEL

CROSS-REFERENCE TO RELATED APPLICATIONS

This application claims benefit of PCT/FI2020/050691 filed Oct. 21, 2020, which claims benefit of Finnish Patent Application No. FI 20195912 filed Oct. 24, 2019, each of which is incorporated by reference in its entirety.

FIELD OF THE INVENTION

The invention is related to an NMR measurement unit, which includes
a flow channel comprising a first end and a second end for separating a sample from a fluid stream present in a process channel via the first end and for returning the sample to the fluid stream via the second end,
a magnet arranged in relation to the flow channel for creating a magnetic field at least in a part of the flow channel,
a coil arranged in relation to the flow channel for exciting NMR active nuclei of the sample moving in the flow channel and for receiving the frequency pulse that returns to the coil from the NMR active nuclei.

The invention is also related to an NMR measurement system.

BACKGROUND OF THE INVENTION

NMR (Nuclear Magnetic Resonance) measurement can be used to determine properties of materials for several different purposes. In the process industry, NMR measurement can be used in the structural analysis of molecules and thereby, in the measurement of materials contained in processes.

Publication WO 2017/220859 A1 representing prior art proposes a method and equipment for determining the beating rate of a fibre suspension based on an online NMR measurement. In the method, a sample is separated from a process stream into a separate sampling channel passing through an excitation coil and a magnet. Based on the Time Domain NMR Spectroscopy, protons contained in the sample are excited and the magnitude of the frequency pulse returning from protons is measured for determining the characteristics of the sample.

However, a problem related to a method and equipment similar to the publication is that the equipment requires space outside the process pipe and is difficult to move from one place to another. In addition, collecting a representative sample from the process stream can be challenging.

U.S. Pat. No. 8,860,412 B2 discloses a methods and system for measuring nuclear magnetic resonance characteristics of formation fluid utilizing micro-NMR sensors. The micro-NMR sensors can be used to analyze fluid flowing through the wellbore on a periodic, continuous, and/or batch-mode basis. More efficient sampling and analysis can be conducted using the micro-NMR sensors. In situ analysis and time-lapse logging are also enabled.

U.S. Pat. No. 3,528,000 A discloses shows a logging tool which is used to examine mud in a borehole. A mud sampling tube extends through opposite side walls of the housing of the NMR logging apparatus. A pressure-tight housing surrounds the magnet, RF-coils, and the tube.

US 2016/305239 A1 discloses a downhole logging tool including an NMR measurement system with surface NMR microcoils located on an outer surface of the downhole logging tool. Each surface NMR microcoil has a central axis and is distributed around the outer surface of the logging tool with the surface NMR microcoil central axis perpendicular to the longitudinal axis of the logging tool. The NMR measurement system may have a central flow line in fluid communication with the drilling fluid. Additional surface NMR microcoils or a flow line microcoil may be disposed circumferentially around the central flow line with the surface NMR microcoil central axis and the flow line NMR microcoil central axis, respectively, perpendicular and parallel to the central flow line longitudinal axis. The NMR measurement system may include a bypass flow line in fluid communication with fluid in the wellbore annulus and/or the drill pipe.

U.S. Pat. No. 9,720,128 discloses an NMR method and apparatus for analyzing a sample of interest applies a static magnetic field together with RF pulses of oscillating magnetic field across a sample volume that encompasses the sample of interest. The RF pulses are defined by a pulse sequence that includes a plurality of measurement segments configured to characterize a plurality of relaxation parameters related to relaxation of nuclear magnetization of the sample of interest. Signals induced by the RF pulses are detected in order to derive the relaxation parameters. The measurement segments of the pulse sequence include at least one first-type measurement segment configured to characterize relaxation of spin-lattice interaction between nuclei of the sample of interest in a rotating frame ($T1\rho$) at a predefined frequency. The $T1\rho$ parameter can be measured in conjunction with the measurement of other relaxation and/or diffusion parameters as part of multidimensional NMR experiments.

SUMMARY OF THE INVENTION

The object of the invention is to provide an NMR measurement unit, which can be placed in the process in the same way as a measurement sensor so that the sample need not be taken out from the process channel. The present invention is characterized by an NMR measurement unit, which includes a frame comprising a fastening flange for sealing the measurement unit to the process channel and a chamber closed at least relative to the fluid stream and arranged to be installed at least mainly inside the process channel. In addition, the measurement unit includes a flow channel comprising a first end and a second end for separating a sample from a fluid stream present in the process channel via the first end and for returning the sample to the fluid stream via the second end. The flow channel passes through the chamber and the frame can be installed in such a way that the flow channel is positioned inside the process channel. The measurement unit further includes a magnet arranged in relation to the flow channel for creating a magnetic field at least in a part of the flow channel and a coil arranged in relation to the flow channel for exciting NMR active nuclei of the sample moving in the flow channel and for receiving the frequency pulse that returns to the coil from the NMR active nuclei. The magnet and the coil are arranged inside the chamber.

Thanks to the frame comprising a fastening flange and a chamber, the NMR measurement unit can be placed inside the process channel in such a way that the fluid stream flowing in the process channel goes through the NMR measurement unit via the flow channel and the measurement can be taken without separating the sample into separate pipelines outside the process channel. Due to the frame, the NMR measurement unit is easy to install and move in the same way as any conventional sensor designed for process measurement, such as a temperature sensor, for example.

Henceforth, the NMR measurement unit is referred to with a simplified designation 'measurement unit'.

Advantageously, the magnet encircles the flow channel. In this way, a magnetic field can be created with one magnet.

Alternatively, it is also possible to provide two or more magnets arranged around the flow channel. In this case, magnets need not be special magnets provided with an opening at the centre for the flow channel.

Advantageously, the coil encircles the flow channel. Thus, excitation of nuclei and the receipt of the frequency pulse can be implemented with one coil.

Alternatively, it is also possible to provide two or more coils arranged around the flow channel.

Then, a large coil is not needed, for example, around a large-diameter process channel, but the coils can be smaller in size.

According to a first embodiment, the measurement unit includes a first valve and a second valve both arranged in the flow channel inside the chamber, one preceding the magnet and the other following the magnet, for stopping the flow in the region of the magnetic field. With the first valve and the second valve, it is possible to stop and isolate a sample in the flow channel and keep it uniform and mainly in place during the measurement. In this way, each excited NMR active nucleus stays in the region of the magnetic field and the coil, until the pulse reflecting back from the NMR active nucleus can be received with the coil and thus included in the measurement. In this way, it is possible to avoid a situation in which part of protons become excited but can exit from the coil region prior to the discharge of excitation and formation of a reflecting pulse at the coil. In this context, the definition "preceding the magnet" means the location in the travel direction of the sample in the flow pipe upstream of the magnet or, in other words, the location between the first end of the flow channel and the magnet.

According to a second embodiment, the measurement unit includes a first valve and a pump both arranged in the flow channel inside the chamber, one preceding the magnet and the other following the magnet, for stopping the flow in the region of the magnetic field, wherein the pump is arranged to aspirate the sample to the flow channel and stop the sample together with the first valve. With such an implementation, it can be ensured that the sample is taken to the flow channel in the case that the fluid stream consists of a high viscosity fluid or other thick stream, for example.

According to a third embodiment, the diameter of the flow channel is continuous and uniform throughout its length. In other words, the measurement unit thus does not include valves arranged in the flow channel, but the flow channel is of a flow-through type and the measurement is taken from a moving fluid. Advantageously, this is suitable for fluids moving at a lower speed than 1 m/s, wherein the nuclei cannot escape through the magnetic field too fast and, on the other hand, have enough time to become sufficiently excited so that an adequately large frequency pulse can be generated at the coil.

Advantageously, in a situation according to a third embodiment, wherein, in addition, the flow speed of the fluid exceeds 1 m/s, a pre-magnet placed in the process stream prior to the measurement unit is used in relation to the measurement unit, enabling partial excitation of nuclei already prior to the generation of a magnetic field by the magnet of the measurement unit, for providing sufficiently large frequency pulses at the coil regardless of the high flow speed of the fluid.

Advantageously, the flow channel includes a pipe provided with a coating that prevents soiling, preferably a Teflon pipe having two ends. In this way, the flow channel keeps clean in a better way in the region of the magnetic field, the measurement unit is more maintenance-free and soiling does not cause an error in the measurement.

The pipe preferably includes fastening means for fastening the pipe removably to the first valve and the second valve or to the first valve and the pump. Thus, the pipe is easy to maintain and clean in case of soiling, without removing the entire measurement unit.

Alternatively, the measurement unit may also include a nozzle placed in relation to the first end of the flow channel for feeding a pressurized medium, preferably water or air, to the flow channel at intervals for keeping it clean.

The flow channel is advantageously composed of a pipe and a first valve and a second valve, or a pump instead of the second valve.

Advantageously, the chamber extends perpendicularly from the fastening flange. Such a construction is easy to manufacture.

The chamber can have a round shape or preferably an elliptical shape seen in the perpendicular direction relative to the fastening flange for reducing the flow resistance caused by the measurement unit. Thus, the measurement unit does not notably increase pumping costs related to the fluid stream of the process channel.

The chamber may include a closable cover for closing the measurement unit. In this way, the magnetic field generated by the magnet of the measurement unit cannot extend to the environment and, on the other hand, components of the measurement unit are protected inside a closed chamber.

Advantageously, the fastening flange includes a bolt rim for fastening the measurement unit to an opening included in the process channel, such as one or more openings of a wall of the process channel. In this way, the measurement unit is easy to fasten tightly, for example, to an inspection hatch type opening in the pipe that functions as the process channel, instead of an inspection hatch cover.

Advantageously, the measurement unit is a time domain NMR measurement unit. Time domain measurement is a simple and relatively fast measurement method, thus enabling a fast measurement of the sample.

The diameter of the chamber may be in the range of 200-450 mm, preferably 300-350 mm. Thus, the flow resistance caused by the measurement unit remains moderate.

The NMR active nucleus is preferably a proton.

The fluid stream is preferably a liquid stream. A liquid stream has a sufficiently large amount of NMR active nuclei, preferably protons, so that NMR measurement can be completed relatively quickly without a long sampling time.

The inner diameter of the flow channel may be in the range of 2-30 mm, preferably 10-20 mm. A flow channel with an inner diameter of 10-20 mm is particularly suitable for analysing liquid samples, since the flow channel is thus sufficiently large to prevent the sample from adhering to the flow channel walls because of the surface tension between the flow channel and the sample.

Advantageously, the frame includes a lead-through for leading said communication cable from the measurement unit to the computing unit. In this way, measurement data and control commands can be reliably taken into a closed chamber, as the computing unit is located elsewhere.

Alternatively, if the sample is gas, the flow channel preferably has a diameter of 2-10 mm so that the NMR active nuclei over the magnet range can be collected closer to each other for the measurement. When analysing gas, instead of a second valve, it is particularly advantageous to use a pump to pressurize and more intensively compact the NMR active nuclei in the region of the magnetic field, the measurement thus being faster.

According to an embodiment, the measurement unit can include cleaning equipment arranged in relation to the first end of the flow channel, comprising a nozzle, a pressure medium channel connected to the nozzle and a pump connected to the pressure medium channel for feeding a pressure medium from the nozzle to the flow channel for cleaning it. For example, the pressure medium can be water or compressed air. With such cleaning equipment, the flow channel can be cleaned from the solid matter without removing the measurement unit from the process stream.

Another object of the invention is to provide an NMR measuring system, where the measurement unit can be installed in the process in the same way as a measurement sensor. The present invention is characterized by an NMR measurement system, which includes an NMR measurement unit for performing an NMR measurement on a sample separated from a process channel for forming a measurement signal and a computing unit connected to the measurement unit for controlling the operation of the measurement unit and computing selected properties based on the measurement signal. In the measurement system, the NMR measurement unit includes a frame comprising a fastening flange for sealing the measurement unit to the process channel and a chamber closed at least relative to the fluid stream and arranged to be installed at least mainly inside the process channel. In addition, the measurement unit includes a flow channel comprising a first end and a second end for separating a sample from a fluid stream in the process channel via the first end and for returning the sample to the fluid stream via the second end. The flow channel passes through the chamber and the frame can be installed in such a way that the flow channel is positioned inside the process channel. The measurement unit further includes a magnet arranged in relation to the flow channel for creating a magnetic field at least in a part of the flow channel and a coil arranged in relation to the flow channel for exciting NMR active nuclei of the sample moving in the flow channel and for receiving the frequency pulse that returns to the coil from the NMR active nuclei. The magnet and the coil are arranged inside the chamber.

In the NMR measurement system according to the invention, the measurement unit comprises a frame, which enables the positioning of the measurement unit at least partly inside the process pipe, thus avoiding the need of guiding the fluid stream out from the process pipe. On the other hand, the computing unit can be located in a freely selectable position, reachable via a connection. Henceforth, the NMR measurement system is referred to with a simplified designation 'measurement system'.

The measurement unit advantageously includes a communication cable for transferring control commands from the computing unit to the measurement unit and for transferring measurement data from the measurement unit to the computing unit, and the frame includes a lead-through for leading through said communication cable. In this way, measurement data and control commands can be reliably taken into a closed chamber, as the computing unit is located elsewhere.

According to an embodiment, the measurement system is arranged to determine the solid content of black liquor and the computing unit includes software means arranged to compute the solid content of black liquor using the general correlation function form $SC=A*T2(R_{2TC})+B$, where SC is the solid content of black liquor, $T2(R_{2TC})$ is the spin-spin relaxation time with corrected temperature, A is a constant and B is a constant. Most advantageously, the solid content of black liquor is determined using the correlation function form $SC=14.211\ln(R_{2TC})+3.05$, where $R_{2TC}$ is the temperature-corrected relaxation time. It has been discovered that this kind of computing method has good accuracy.

With the measurement unit and measurement system according to the invention, it is possible to reduce costs related to the use of NMR measurement in the process environment and facilitate its introduction into use. A measurement unit using a frame is positioned inside a process channel, thus the sample obtained from the fluid stream being more representative and the measurement unit does not take space outside the process channel. On the other hand, a measurement unit according to the invention is easy to install in inspection hatches or service openings of an existing process channel without forming additional openings or channels. Furthermore, a measurement unit according to the invention is relatively simple and maintenance-free and enables NMR measurement in the same way as conventional sensors. Traditionally, NMR measurements have been performed using separate, even offline systems, which at least guide the fluid stream out from the process channel. The NMR measurement unit and the NMR measurement system according to the invention are suitable for use for the analysis of both liquid and gaseous samples; however, samples are most preferably liquid, in which case there are more NMR active nuclei in the sample and the determination can be performed faster.

BRIEF DESCRIPTION OF THE DRAWINGS

The invention is described below in detail by making reference to the appended drawings that illustrate some of the embodiments of the invention, in which.

DETAILED DESCRIPTION OF THE INVENTION

In the embodiment of the invention illustrated in FIGS. 1a-7b, the sample is liquid and the NMR active nuclei contained therein are protons. In this context, it is obvious to those skilled in the art that the invention can also be implemented when the fluid stream is gas and the NMR active nuclei are generally known NMR active nuclei other than protons, such as oxygen or phosphor.

Figure 1A:
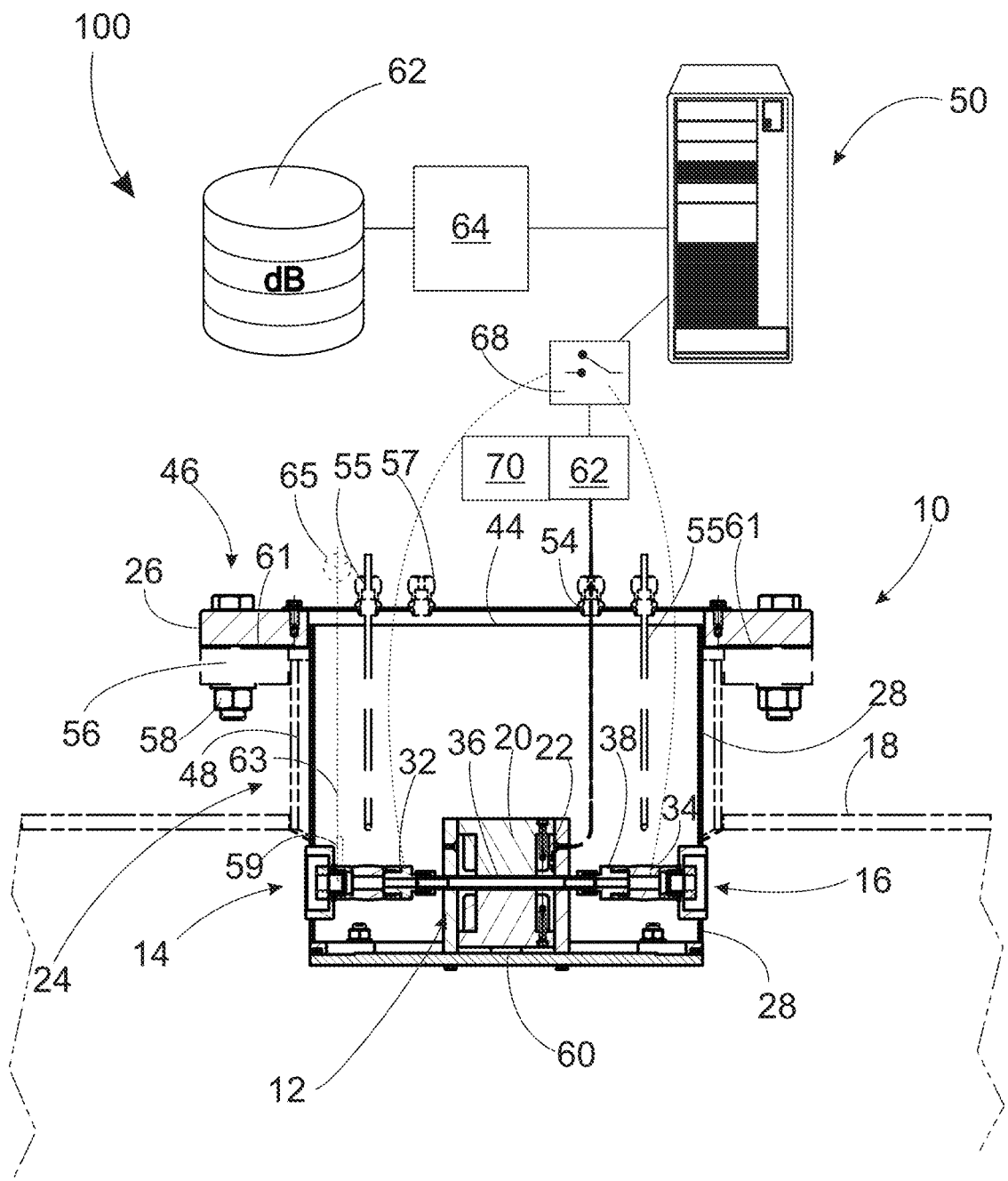
FIG. 1a is a basic view of a measurement system according to the invention, with the measurement unit according to the invention split.
Figure 1B:
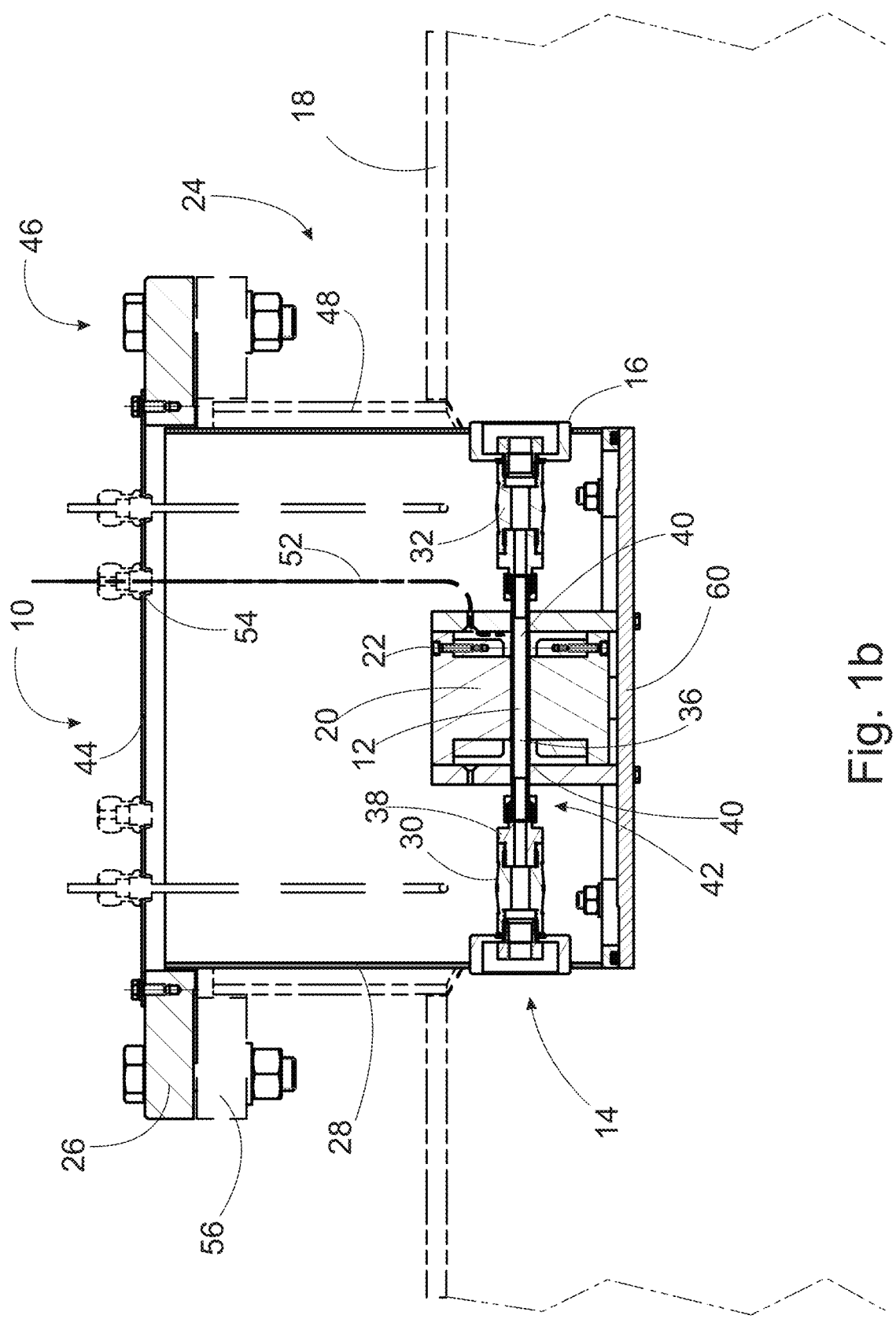
FIG. 1b is an enlarged view, with the measurement unit according to the invention split.

According to FIGS. 1a and 1b, a measurement unit 10 according to the invention is arranged to be used installed in a process channel 18 as part of a measurement system 100 according to the invention in the same way as a measurement sensor. The measurement unit 10 can be positioned, as shown in FIG. 1a, at least partly inside the process channel 18 in such a way that at least part of the process stream flowing in the process channel 18 meets the measurement unit 10 and flows through the measurement unit 10. The measurement unit 10 is advantageously connected to an existing process channel 18, such as a process channel related to the processing of black liquor. In other words, a separate side flow channel separated from the process channel is not needed for the measurement unit.

The measurement system 100 according to the invention includes, as the main components, a measurement unit 10 and a computing unit 50, quite the same way as in prior art measurement systems. The measurement unit 10 and the computing unit 50 are preferably placed separated from each other, thus avoiding the need to protect the computing unit 50 from surrounding conditions. It is advantageous to place the computing unit in the control room of a process plant, for example, or another similar room where the conditions are favorable in regard to the durability of electronics, contrary to what is often the case with process channels. In this way, it is possible to increase the lifecycle of the computing unit and extend its maintenance interval, as the computing unit is not exposed to heat, vibration or dust. According to the invention, the measurement unit 10 is integrated as part of the process channel 18, thus enabling the measurement without leading the process stream out from the process channel for the measurement. This results in that the measurement system can be relatively small in size and easily installable in the process channel.

The measurement unit 10 includes a frame 24 comprising a fastening flange 26 for sealing and fastening the measurement unit 10 to a process channel 18 and a chamber 28 that is closed at least relative to the fluid stream and connected to the fastening flange 26, arranged to be installed at least mainly inside the process channel 18. In addition to the frame 24, the measurement unit 10 includes a flow channel 12 comprising a first end 14 and a second end 16 for separating a sample from a fluid stream present in the process channel 18 via the first end 14 and for returning the sample to the fluid stream via the second end 16. More precisely, the flow channel passes through the chamber 28. Thanks to the fastening flange 26, the frame 24 is installable in such a way that the chamber 28 and the flow channel 12 passing through it are located inside the process channel 18. Thus, the fluid stream flowing in the process channel 18 meets the chamber 28 of the measurement unit 10 and can be carried to the flow channel 12 via the first end 14 of the flow channel 12 and discharged from the second end 16 of the flow channel 12 back to the process channel 18 after the measurement.

Figure 4:
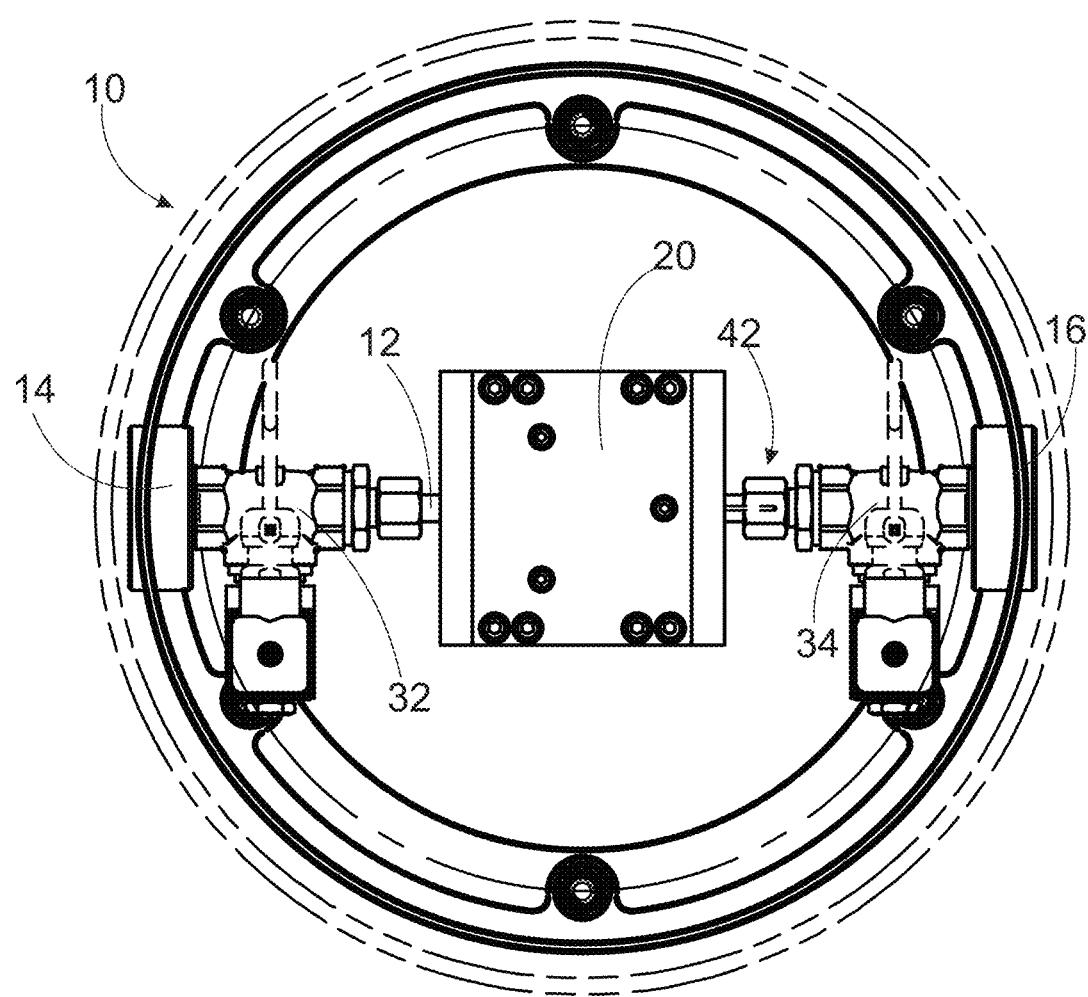
FIG. 4 is a bottom view of a measurement unit according to the invention without the bottom.
Figure 6A:
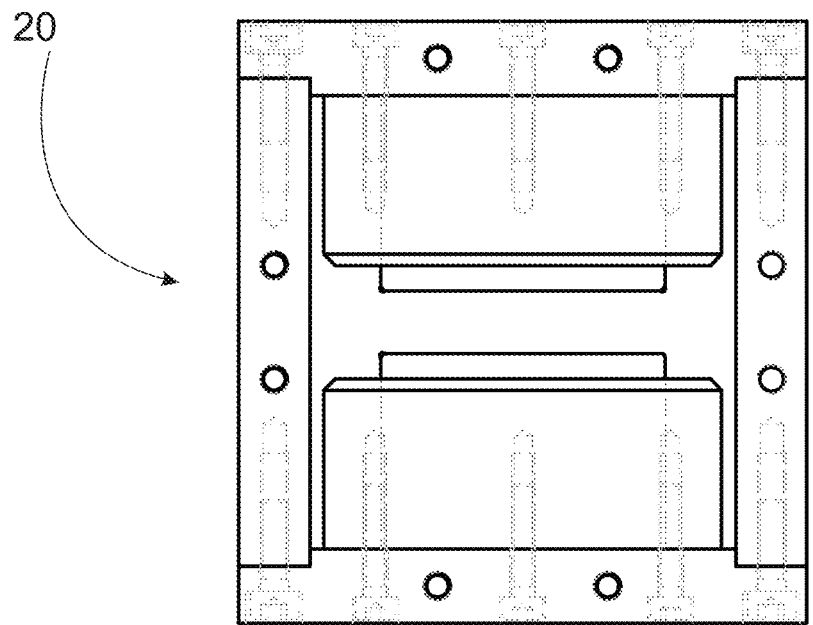
FIGS. 6a and 6b illustrate the magnet of a measurement unit according to the invention, separated, in different directions.
Figure 6B:
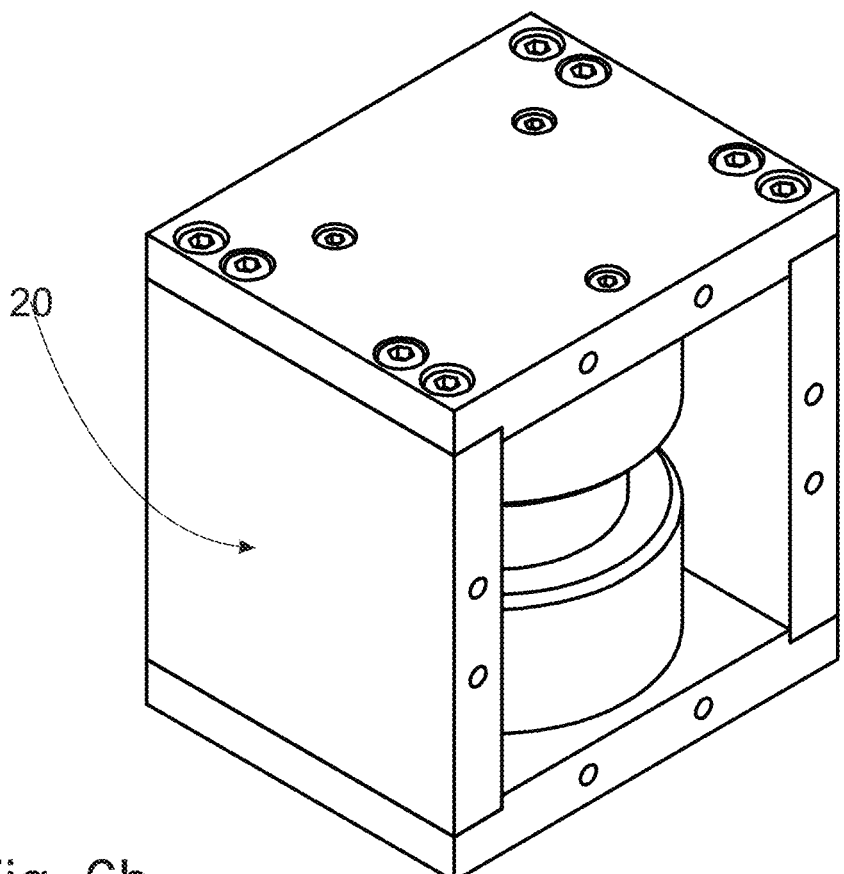

Furthermore, the measurement unit 10 includes a magnet 20, arranged inside the chamber 28, which preferably encircles the flow channel 12 for creating a magnetic field E at least in part of the flow channel 12, and a coil 22, which preferably encircles the flow channel 12 for exciting the protons of the sample moving in the flow channel 12 and receiving the frequency pulse that returns from the protons back to the coil 22. The magnet 20 and the coil 22 can be formed as one easily connectable and removable package, which is illustrated in FIGS. 4 and 6a and 6b. In this way, the magnet 20 and the coil 22 can be easily removed from the measurement unit for maintenance and cleaning without removing the entire measurement unit 10.

Alternatively, according to an embodiment, the measurement unit 10 can include cleaning equipment shown in FIG. 1a, arranged in relation to the first end 14 of the flow channel 12, comprising a nozzle 59, a pressure medium channel 63 connected to the nozzle 59, and a pump 65 connected to the pressure medium channel 63 for feeding a pressure medium from the nozzle to the flow channel 14 for cleaning it. For example, the pressure medium can be water or compressed air. With such cleaning equipment, the flow channel can be cleaned from the solid matter without removing the measurement unit from the process stream. Instead of what is illustrated in the figure, the nozzle can also be connected to a different point in the flow channel.

The frame 24 can be made of acid-proof steel, for example, with a thickness of 4-8 mm, thus enduring the conditions prevailing in the process channel, such as a high pH or alternatively a low pH of liquid that serves as the fluid stream. A metal frame 24 also prevents the magnetic field from extending to the environment and, on the other hand, disturbances external to the measurement unit from entering the magnetic field of the measurement unit. In this way, the measurement unit according to the invention can easily provide a closed magnetic field and is thus easily applicable in plant conditions. Advantageously, the fastening flange 26 has a circular shape and is dimensioned to correspond with the inspection hatches provided in the process channel of the application. This enables the fastening of the measurement unit directly to an existing inspection hatch, thus avoiding the need to provide the process channel with new openings or lead-throughs, which are susceptible to leaks. The fastening flange 26 includes, in relation thereto, a bolt rim 46 shown in FIG. 3, with the bolts 58 installed therethrough enabling the locking and sealing of the measuring unit 10 to the opening 48 of the process channel 18 and to the inspection hatch of the counter bolt ring 56. A seal 61 is advantageously provided between the bolt rim 46 and the counter bolt ring 56 to seal the connection.

Figure 5:
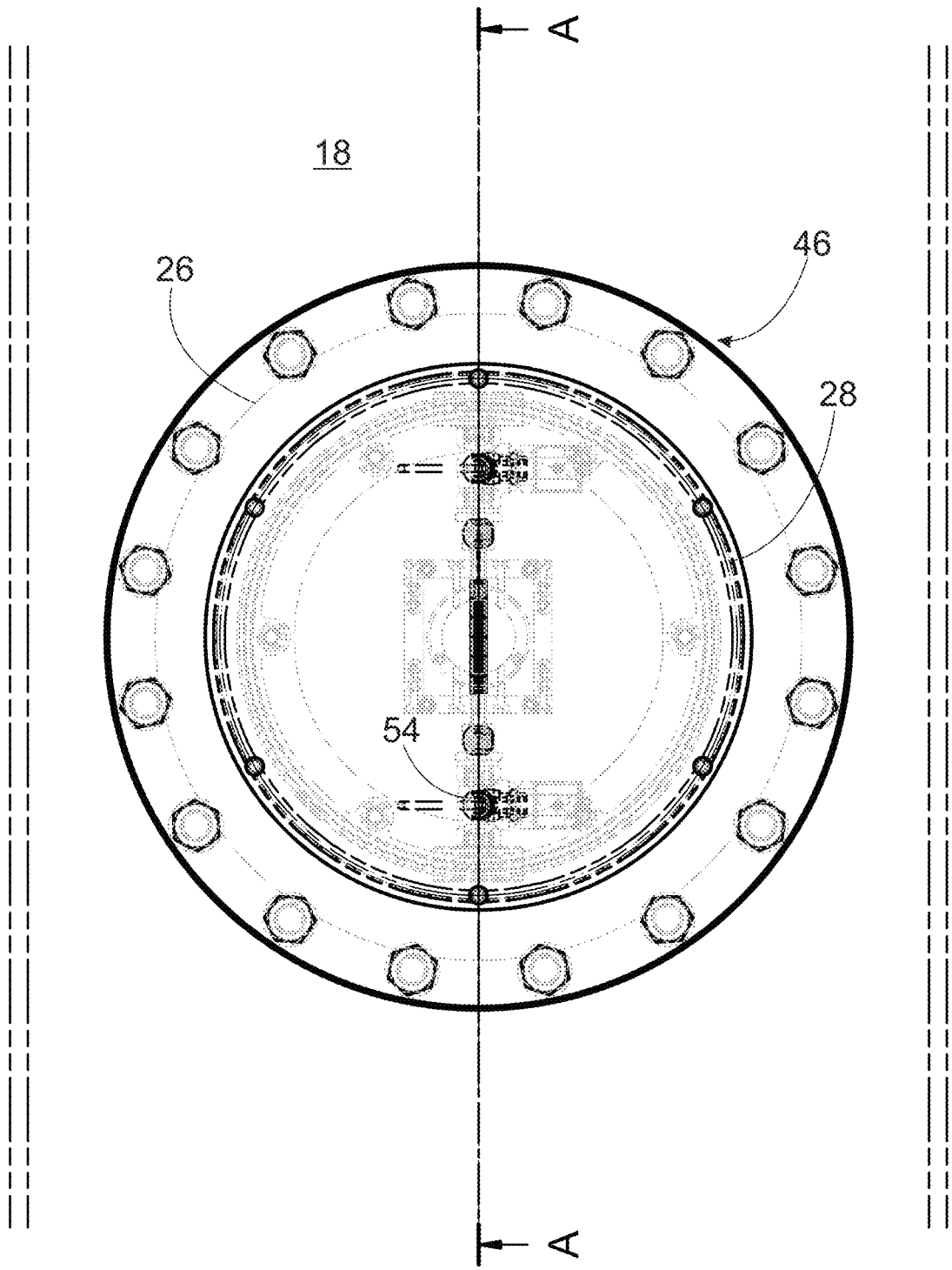
FIG. 5 is a top view of a measurement unit according to the invention.
Figure 7B:
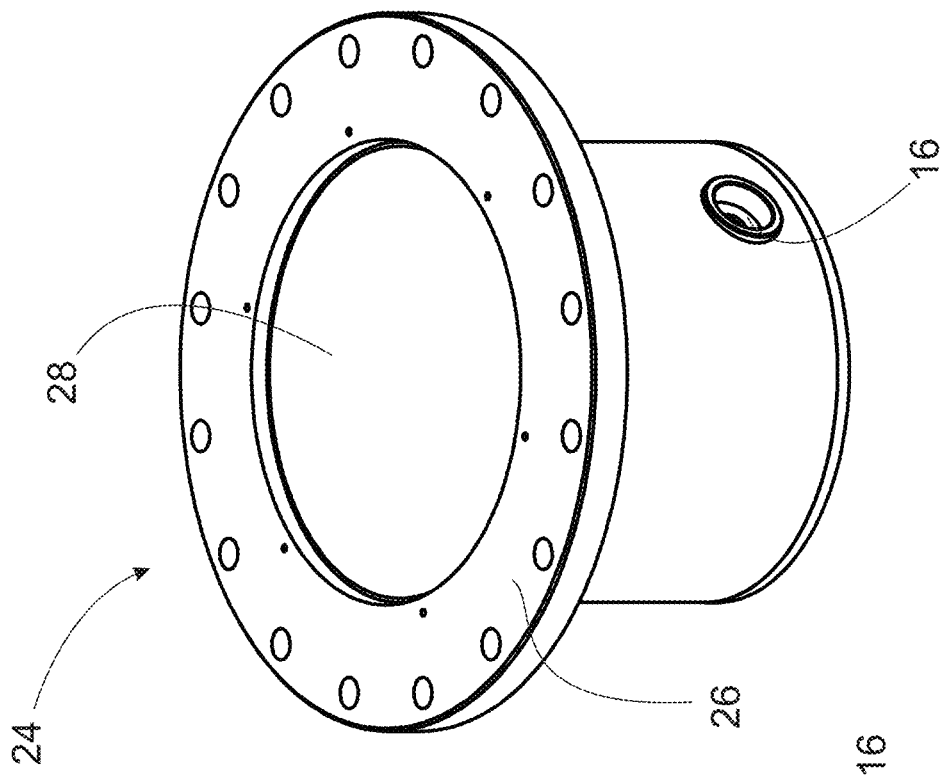
FIGS. 7a and 7e illustrate the frame of a measurement unit according to the invention in different directions.
Figure 7A:
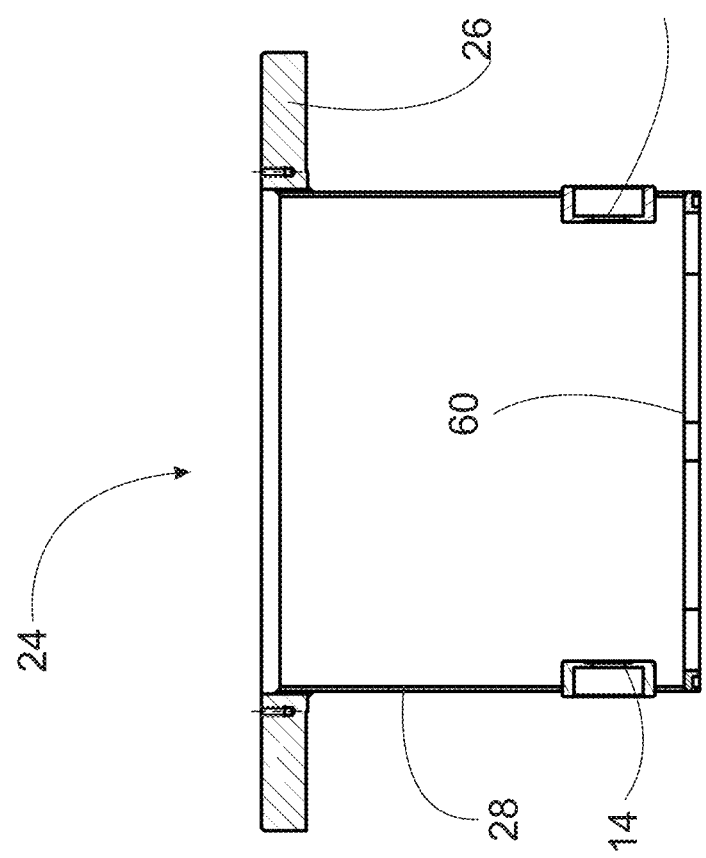

In turn, the chamber 28 also advantageously has a circular cross-section cut in the direction of the plane of the fastening flange 26, as in FIGS. 5, 7a and 7b, or alternatively, an elliptical or oval shape, so that the pressure loss caused by the measurement unit in the process channel is as small as possible. Most advantageously, the shape of the cross-section is elliptical, in which case the smallest cross-section of the ellipse is set parallel to the flow direction for minimizing pressure losses in the fluid stream. According to FIGS. 1a and 1b, the chamber 28 is dimensioned in such a way that the chamber 28 extends inside the walls of the process channel 18 so that the flow channel 12 is positioned directly in the pathway of the fluid stream. In some cases, the chamber 28 can also be dimensioned even so that the flow channel 12 is positioned in the centre line of the process channel 18 deviating from it by a maximum of 10% of the diameter of the process channel. Thanks to the flow channel placed in the centre line of the process channel or near it, sampling is reliable and a representative sample can be taken from the fluid stream, as the fluid stream is uniform at the centre of the process channel.

In an advantageous embodiment, the frame 24 is so dimensioned that the height of the frame 24 is in the range of 250-330 mm, the diameter of the fastening flange in the range of 400-600 mm and the chamber diameter in the range of 250-400 mm. The inner diameter of the flow channel may be in the range of 5-30 mm, preferably 10-20 mm and the diameter of the centre hole in the range of 30-50 mm. Since the weight of such a measurement unit is at most 30 kg, it is easy to install and move to the application site.

Figure 2:
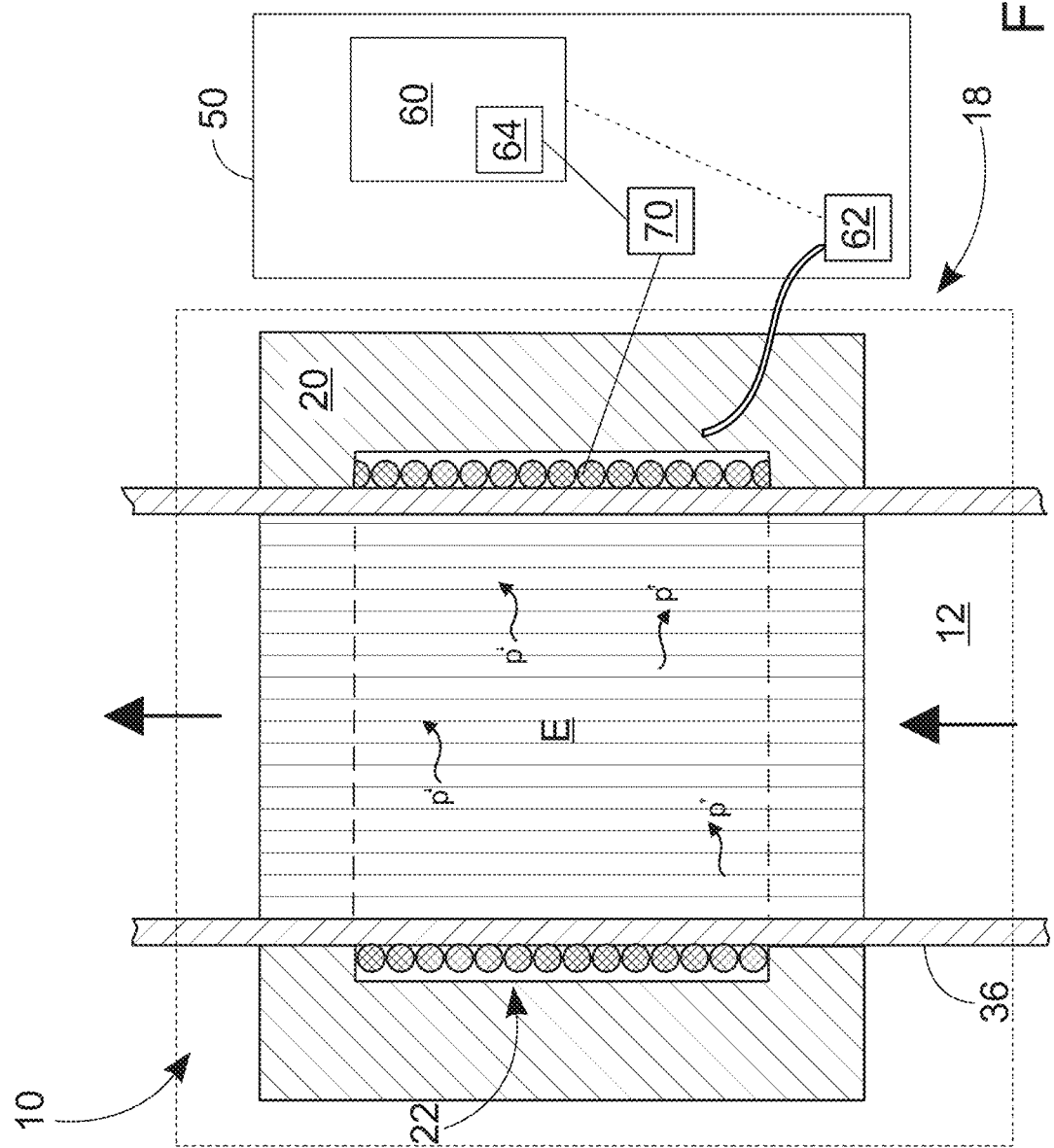
FIG. 2 is a lateral basic view of the magnet of the measurement unit.
Figure 3:
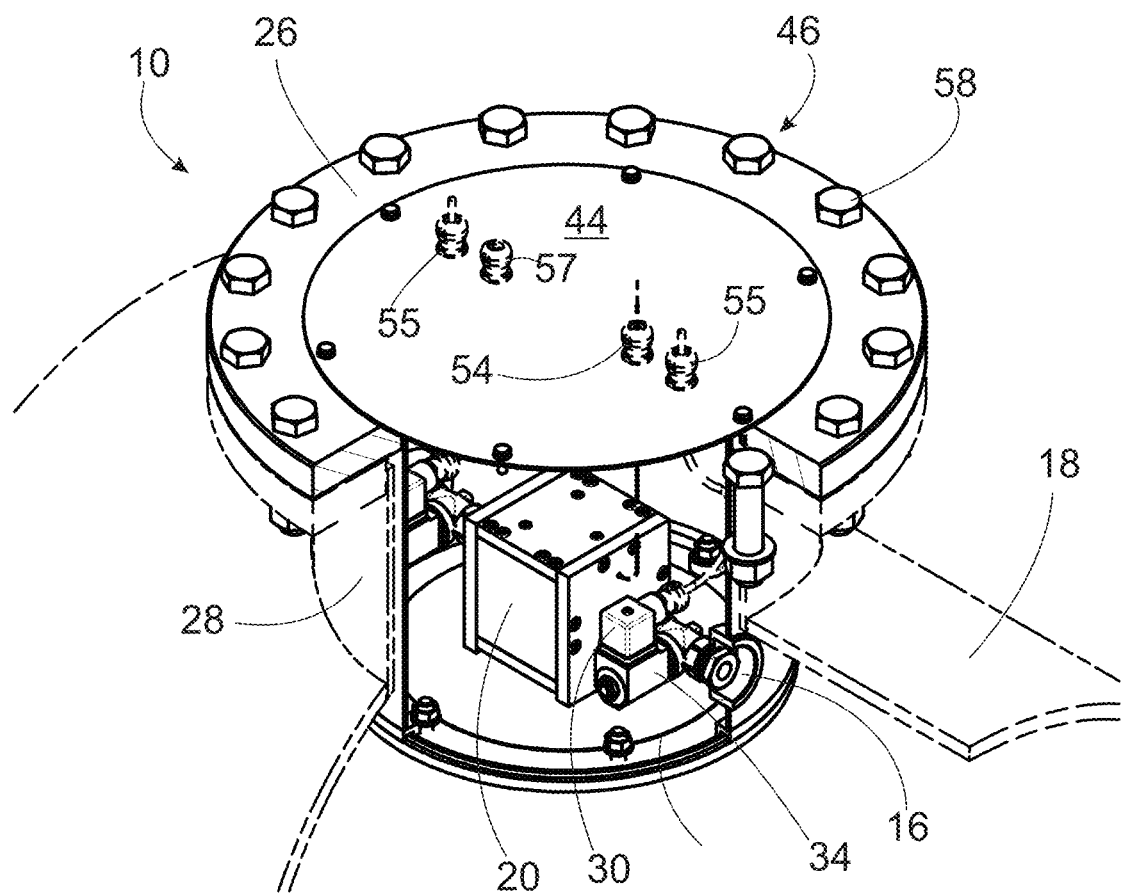
FIG. 3 is an axonometric view of a measurement unit according to the invention, separated and partly cut.

In an advantageous embodiment, the measurement unit 10 additionally includes at least a first valve 32, with which the sample guided to the flow channel 12 is stopped during the measurement. In addition to the first valve 32, the measurement unit 10 then includes either a second valve 34 or, alternatively, a pump. In this case, the purpose of the first valve 34 or the pump is to stop the sample, together with the first valve 32, in the flow channel 12 by momentarily closing the flow channel 12 at both the first end 14 and the second end 16. The purpose of stopping the sample is to ensure that protons p of the sample that are excited thanks to the frequency pulse provided by the coil 22 also release their energy in the region of the magnetic field E thus enabling the signal that returns to the coil from the protons p to be received again at the coil 22 for the measurement, as shown in FIG. 2.

The pump is used to stop the sample particularly in the case that the measurement unit is used to take a sample from a fluid stream that has a high viscosity. Thus, the pump can be used to aspirate the sample from the process channel to the flow channel and thereby ensure that the sample can be guided to the flow channel that has a notably smaller diameter compared to that of the process channel. This also enables the use of a relatively small diameter for the flow channel, since, assisted by the partial vacuum provided by the pump, the sample can be led to the flow channel in spite of the surface tension between the flow channel and the sample. If the viscosity of the fluid stream is low, a second valve can be used. For example, the pump can be a hose pump.

Advantageously, there is a pipe 36 functioning as a flow channel 12 between the first valve 32 and the second valve 34 or between the first valve and the pump. The pipe 36 advantageously includes fastening means 42 at both ends 40 enabling disconnection of the pipe 36 from the measurement unit 10 for cleaning. The diameter of the flow channel can be in the range of 2-30 mm, preferably 10-20 mm, thus allowing for the liquid sample to flow in the flow channel without problems. If the sample is gas, the diameter of the flow channel can be in the range of 2-10 mm. The solid content of the sample can generally range between 0.5% and 4.0% by weight remaining thus pumpable. A small diameter of the flow channel proposed above also enables the use of a smaller coil. In this case, the centre hole of the magnet placed on the coil, advantageously above the flow channel, can have a smaller diameter, approximately as small as between 30 mm and 40 mm. The manufacturing costs of the magnet are generally the lower, the smaller is the hole that needs to be produced in the magnet.

Instead of the straight pipe shown in FIGS. 1a and 1b, the flow channel can also be a pipe that forms a curve and has sections running toward the cover of the chamber. In this way, the magnet can be placed in the sections that run toward the cover of the chamber, upper from the chamber bottom, and the height of the chamber can be made lower. The measurement unit can also include a bypass pipe, which passes by the first and the second valve and the pipe between these allowing for the fluid stream that enters from the first end of the flow channel to pass the magnet during the stopping of the sample present therein. This reduces the flow resistance caused by the measurement unit in the process channel.

The size of the sample conveyed from the fluid stream to the flow channel of the measurement unit can be as small as 1-10 $cm^3$, in which case the measurement unit is also relatively small-scale. However, such a sample is sufficient for determining a selected property of the fluid stream using the NMR measurement technique.

FIG. 2 is an enlarged basic view of an advantageous design of the magnet 20 and the coil of the measurement unit, placed around the pipe 36 included in the flow channel 12. The coil 22 is preferably arranged around the pipe 36 for exciting the protons p contained in the sample. The magnet 20 is also preferably arranged around the pipe 36 for creating a magnetic field E in the flow channel 12. Advantageously, the magnet 20 is also arranged around the coil 22 in the radial direction relative to the flow channel 12 above the coil 22. The magnetic field E generated by the magnet 20 is advantageously a magnetic field as homogeneous and static as possible, through which the sample travels within the flow channel 12. The magnetic field E is depicted in the figure with lines in the transverse direction relative to the flow channel. The direction of the magnetic field is advantageously transverse relative to the longitudinal direction of the flow channel. The magnet is advantageously a permanent magnet, which can be implemented without separate driving power in order to operate. A permanent magnet generates a static permanent magnetic field in itself. Alternatively, the magnet can also be an electromagnet, the magnetic field of which is provided by electric current.

In addition, according to FIG. 2, the measurement system 100 includes a power source 62 connected to the coil 22 for generating frequency pulses and measuring equipment 70 for measuring the intensity of voltage generated by the frequency pulse that returns to the coil 22 from protons p, for forming a backward signal. Furthermore, the measurement system 100 includes software means 64 for determining a selected property of samples based on the backward signal. Software means 64 are also arranged to control the first valve and the second valve or the first valve and the pump for sampling and stopping the sample. With the power source 62, a frequency pulse is delivered to the coil 22 to excite protons p travelling through the coil 22 inside the pipe 36 into a higher energy state (spin) while the protons absorb the frequency pulse. This energy state discharges quickly (within milliseconds), the proton p thus releasing or emitting energy to its environment. Energy emitted by the proton generates a voltage in the coil 22, i.e., a backward signal, the amplitude of which can be measured with the measuring equipment 70.

Properties of the sample can be determined based on NMR measurement by measuring the relaxation time between the excitation and discharge of protons. The relaxation time correlates with physical properties of the sample. When examining black liquor, for example, the relaxation time correlates with the dissolved solid content of black liquor in such a way that an increased solid content changes the relaxation time so that the relaxation time T2 shortens as the solid content increases. The so-called CPMG (Carr-Parcell-Meiboom-Gill) pulse sequence, which contains one 90° pulse and several 180° pulses, can be used to determine the spin-spin relaxation time T2. Amplitudes of echoes of the pulse sequence attenuate according to the following equation:

$$a(t)=a_o \exp(-t/T2),$$

where $a_0$ is the amplitude at the time t=0 s and T2=spin-spin relaxation time. Parameters $a_o$ and T2 can be defined by placing the equation in an experimental signal.

The measurement unit according to the invention can be implemented using one coil or with two coils. When one coil is used, the same coil both delivers and receives the frequency pulse. When two coils are used, one coil can deliver the frequency pulse and the other one receives it. However, use of one coil is also possible, when the sample is stopped in the flow channel, thus the same protons that are exposed to the frequency pulse also having time to deliver the backward signal in the coil region. When implemented with one coil, the measurement unit is simpler in design compared to the use of two coils. The coil, also called a bobbin, used in the device is electrically dimensioned in such a way that, with a selected power source, it can produce the desired frequency pulse, or excitation pulse, in a selected magnetic field. For example, when the strength of the magnetic field E is 0.5 T, the frequency pulse applied is in the frequency range of 25 MHz-26 MHz. Generally, the frequency pulse used is in the range of 50 kHz-150 MHz. When one coil is used in the measurement, the length of the coil used may be in the range of approximately 10-20 cm, thus protons in the sample having time to become excited and release energy over the coil length. The coil may have 100-200 turns.

Energy released by the proton p excited according to FIG. 2 provides a backward frequency in the coil 22, which can be measured as a backward signal. The backward signal to be measured can be measured with extremely sensitive measuring equipment 70, for example, with a receiver whose measuring accuracy can be in the class of 1 μV. The backward signal to be measured is only an average signal; that is, momentary values are measured for the backward signal in a certain period and based on these values, an average is calculated for this period. In other words, the entire spectrum is not measured, as is usually the case in spectroscopy. For example, the length of the period may be between 0.5 s and 2.0 s. Based on the strength of the backward signal, the relaxation times T1 and T2 of the proton can be calculated. For example, the relaxation time can be calculated with the following formula:

$$T2 = -t/\{\ln[a(t)/a_o]\}$$

Advantageously, software means 64 can be implemented in a computing unit 50, which can be used to display results and control the device. The computing unit can be a normal PC or equivalent. The material of the flow channel is preferably glass, Teflon or other equivalent non-magnetic material, which does not disturb the generation of the magnetic field within the flow channel. In turn, the power source is an AC power source, in relation to which a frequency converter can be used to achieve the correct frequency.

The functions of the measurement unit can be controlled with the same computing unit, which has software means for determining sample properties based on the relaxation times measured. The measurement unit can be controlled with separate control software, which gives electrical controls along a field bus, for example, to the actuator 30 of the second valve 34, this actuator opening the second valve 34 of the flow channel 12 for taking a sample periodically. According to FIG. 3, the field bus or the communication cable 52 can be led into the chamber through a lead-through 54 provided in the cover 44 of the chamber 28. Correspondingly, according to FIG. 1a, electricity can be supplied to the magnet and the coil via the lead-throughs 55 using electric wires and a pressure medium for operating the valves via the lead-through 57.

Figure 8:
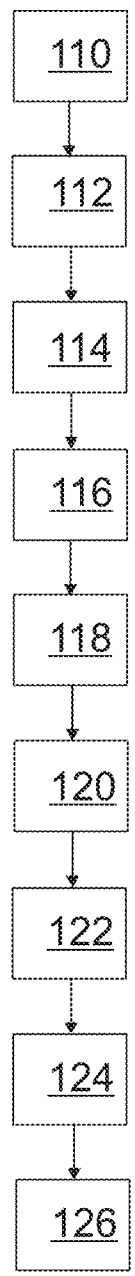
FIG. 8 is a block diagram illustrating the operation of a measurement system according to the invention.

FIG. 8 shows steps 110-126 of a measurement system according to the invention in a block diagram. The operation of the measurement system according to the invention starts from taking a sample. Advantageously, a sample is taken from the process channel 18 according to FIG. 1a by leading a fluid stream to the flow channel 12 from its first end 14 according to step 110. By opening the first valve 32 in step 112, part of the fluid stream is periodically conveyed to the flow channel 12 as a sample. The sample conveyed to the flow channel 12 to the region of the magnetic field generated by the magnet 20 is stopped in step 114 with the second valve 34 and, in step 116, the first valve 32 is closed, the sample thus remaining in the flow channel 12 between the first valve 32 and the second valve 34. Periodically repeated, sampling can be repeated at intervals of 1 to 2 minutes, for example.

The first valve 32 and the second valve 34 are advantageously controlled with the computing unit 50 and software means 64 used in the computer in the computing unit 50, in which the sampling interval or the volume flow per a period of time for the necessary sample stream has been specified. Based on the control software, the computing unit sends a control command along a field bus, for example, preferably to the relay 68 of FIG. 1a, which controls the turn off power supply to the actuators of the first valve 32 and the second valve 34. Advantageously, the first valve 32 and the second valve 34 are solenoid valves, since solenoid valves are not as sensitive to environmental disturbances as other valve types. When the power supply to the actuators of the valves 32 and 34 is turned off with the relay 68, the valves 32 and 34 close, and when energized, the valves 32 and 34 are in their open position enabling the flow of the sample in the flow channel 12.

If a pump is located in the flow channel instead of a second valve, the power supply of the pump advantageously takes place via the same relay, the entire sampling event being thus manageable by controlling one relay. Thus, a sample is aspirated into the flow channel until the sample is conveyed into the magnet, at which time the power supply to the first valve and the pump is turned off with the relay, at which time these close. At the same time, power supply to the pump is turned off. The control of the relay can be implemented with time control, for example.

At the same time, a magnetic field has been created in the measurement unit 10 advantageously with a permanent magnet used as the magnet 20 according to step 116 of FIG. 8. The purpose of the magnetic field is to enable excitation of protons with frequency pulses generated by the coil 22. When generated by a permanent magnet, the magnetic field is permanent and does not require any specific control. In relation to the computing unit, there can also be an electronic control unit, controlled by control means, which in turn controls the power source of the measurement unit to generate frequency pulses at the coil, according to step 118. Frequency pulses are advantageously generated at the frequency indicated previously while the sample is in the magnetic field. Advantageously, the frequency pulse used is the so-called CPMG frequency pulse, which includes one 90° pulse and several 180° pulses. Pulses are delivered in succession and they excite the protons in the magnetic field in step 120. The excitation discharges very rapidly and the energy released by the proton arrives at the coil providing a low voltage in the coil, which is measured with the measuring equipment in step 122. From the measuring equipment, the voltage information can be transferred in the analogue form to an A/D converter or as a digital signal directly to the computing unit 50, where it is stored in a memory 60 with the software means 64 for further processing.

The amplitude of voltage is advantageously measured continuously and momentary measuring results of voltage are stored in the memory. Advantageously, the sample in the magnetic field is exposed to 1-20, preferably 4-8 different frequency pulses generated with the coil; thus, attenuating signals are formed in a number corresponding to that of the frequency pulses and their amplitudes are measured with the measuring equipment. The greater the number of molecules in the sample, the smaller can be the number of frequency pulses with which a sufficient signal/noise value is achieved; it can be greater than 30, preferably greater than 50. An average can be calculated of the amplitudes measured with the software means 64 of FIGS. 1a and 2. In addition, an average can be calculated over successive samples, since variations between individual samples are notably greater than variations between the successive signals of the same sample.

The relaxation time T1 or T2 of the proton calculated based on the measured amplitude of the backward signal is used together with the empirically defined correlation function to determine a selected property of the sample with software means 64 in step 124. Advantageously, the correlation function is defined with empirical tests. Based on a determination, for determining the solid content (SC) of black liquor, the following correlation function was obtained: $SC=14,211\ln(R_{2TC})+3.05$, where $R_{2TC}$ is the temperature-corrected relaxation time. More generally, the correlation function has the form $SC=A*T2(R_{2TC})+B$, where SC is the solid content of black liquor, $T2(R_{2TC})$ is the spin-spin relaxation time with corrected temperature, A is a constant and B is a constant. In the actual measurement, the solid content of a black liquor sample, for example, is determined by placing the defined relaxation time in the correlation function according to step 126. The SC index can be presented as a time sequence and an averaging process (moving averaging), for example, can be performed to this to be able to eliminate differences between the samples. Finally, the result of the determined solid content can be transferred to the plant information system, for example. Finally, the sample can be conveyed back to the process channel 18 from the flow channel of the measurement unit 12 according to step 128.

In this context, the determination of the dissolved solid content of black liquor is presented as one example of the applications of the measurement system and measurement unit according to the invention. However, it is to be understood that suitable applications can be, for example, determinations of water content of black liquor and any determination performed on a liquid-based sample, where the sample contains water and organic matter, thus the relaxation time correlating with the organic matter contained in the sample. Applications can thus be found in studies for mining wastewaters, which contain paramagnetic ions, or biofuels, which do not contain water but organic compounds. In the case of biofuels, the relaxation time correlates, for example, with biofuel properties, such as the cetane number or the carbon chain length.

Equipment according to the invention, excluding the measurement unit, can consist of a commercially available prior art time domain NMR spectroscope. One such useful spectroscope is the device known by the trade name "TD-NMR Analyzer Spin Track" manufactured by Resonance Systems Ltd. Instead of Time Domain NMR spectroscopy, the measurement unit and the measurement system according to the invention can also be used in low-field spectroscopy.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

The invention claimed is:

1. An NMR measurement unit comprising
a flow channel comprising a first end and a second end for separating a sample from a fluid stream present in a process channel via the first end and for returning the sample to the fluid stream via the second end;
a magnet arranged in connection with the flow channel for creating a magnetic field at least in part of the flow channel;
a coil arranged in connection with the flow channel for exciting an NMR active nuclei of the sample moving in the flow channel and for receiving a frequency pulse that returns to the coil from the NMR active nuclei;
a frame being installable in such a way that the flow channel is positioned inside the process channel, the frame comprising a fastening flange for sealing and fastening the NMR measurement unit to an inspection hatch or a service opening in a wall of the process channel, and the NMR measurement unit is adapted to be installed in the inspection hatch or the service opening, respectively, of the wall of the process channel by means of the fastening flange;
a chamber connected to the fastening flange and arranged to be installed at least mainly inside the process channel, said chamber is closed at least relative to the fluid stream, and within said chamber the magnet and the coil are arranged, and through said chamber the flow channel passes, and wherein both the magnet and the coil encircle the flow channel.

2. The NMR measurement unit according to claim 1, further comprising a first valve and a second valve both arranged in the flow channel inside the chamber, the first valve preceding the magnet and the second valve following the magnet, for stopping the sample in a region of the magnetic field.

3. The NMR measurement unit according to claim 1, further comprising a first valve and a pump both arranged in the flow channel inside the chamber, the first valve preceding the magnet and the pump following the magnet or the pump preceding the magnet and the first valve following the magnet, for stopping the sample in the region of the magnetic field.

4. The NMR measurement unit according to claim 2, wherein said flow channel further comprising a pipe equipped with a coating that prevents soiling, having two ends.

5. The NMR measurement unit according to claim 3, wherein said flow channel further comprising a pipe equipped with a coating that prevents soiling, having two ends.

6. The NMR measurement unit according to claim 4, wherein the pipe comprising fastening equipment for fastening the pipe removably by one said end to the first valve and by another said end to the second valve or to a pump, instead of the second valve.

7. The NMR measurement unit according to claim 5, wherein the pipe comprising fastening equipment for fastening the pipe removably by one said end to the first valve and by another said end to the second valve or to a pump, instead of the second valve.

8. The NMR measurement unit according to claim 1, wherein the chamber extends from the fastening flange perpendicularly.

9. The NMR measurement unit according to claim 1, wherein, seen in a perpendicular direction relative to the fastening flange, the chamber has a round shape for reducing flow resistance caused by the NMR measurement unit.

10. The NMR measurement unit according to claim 1, wherein, seen in a perpendicular direction relative to the fastening flange, the chamber has an elliptical shape for reducing the flow resistance caused by the NMR measurement unit.

11. The NMR measurement unit according to claim 1, the chamber comprising a closable cover for closing the NMR measurement unit.

12. The NMR measurement unit according to claim 1, the fastening flange further comprising a bolt rim for fastening the NMR measurement unit to an opening included in the wall of the process channel.

13. The NMR measurement unit according to claim 12, the opening is the service opening or the inspection hatch.

14. The NMR measurement unit according to claim 1, the NMR measurement unit being a time domain NMR measurement unit.

15. The NMR measurement unit according to claim 1, wherein the NMR active nucleus is a proton.

16. The NMR measurement unit according to claim 1, wherein the fluid stream is a liquid stream.

17. The NMR measurement unit according to claim 1, wherein an inner diameter of the flow channel is 2-30 mm.

18. The NMR measurement unit according to claim 1, wherein an inner diameter of the flow channel is 10-20 mm.

19. An NMR measurement system, comprising:

an NMR measurement unit according to claim 1 for performing an NMR measurement on a sample in a process channel for forming a measurement signal; and a computing unit operatively connected to the NMR measurement unit for controlling operation of the NMR measurement unit and computing selected properties based on the measurement signal.

20. The NMR measurement system according to claim 19, wherein said NMR measurement unit further comprising a communication cable for transferring control commands from the computing unit to the NMR measurement unit and for transferring measurement data from the NMR measurement unit to the computing unit, and a frame comprising a lead-through for leading through the communication cable.

* * * * *